(12) United States Patent
Berkley et al.

(10) Patent No.: US 7,990,662 B2
(45) Date of Patent: Aug. 2, 2011

(54) SYSTEMS, METHODS, AND APPARATUS FOR SUPERCONDUCTING MAGNETIC SHIELDING (75) Inventors: Andrew J. Berkley, Vancouver (CA); Sergey V. Uchaykin, Burnaby (CA); Thomas F. W. Mahon, Vancouver (CA)

(73) Assignee: D-Wave Systems Inc., Burnaby (CA)

( * ) Notice: Subject to any disclaimer, the term of this patent is extended or adjusted under 35 U.S.C. 154(b) by 318 days.

(21) Appl. No.: 12/256,330

(22) Filed: Oct. 22, 2008

(65) Prior Publication Data
US 2009/0168286 A1 Jul. 2, 2009

Related U.S. Application Data (60) Provisional application No. 60/981,763, filed on Oct. 22, 2007.

(51) Int. Cl.
*H02H 7/00* (2006.01)
(52) U.S. Cl. .......................... 361/19; 335/216; 174/15.4
(58) Field of Classification Search .................... 361/19; 335/216, 301; 174/15.4, 15.5
See application file for complete search history.

(56) References Cited

U.S. PATENT DOCUMENTS

| | | | |
|---|---|---|---|
| 3,582,851 A * | 6/1971 | Meservey | 336/73 |
| 4,409,579 A * | 10/1983 | Clem et al. | 335/216 |
| 4,740,758 A * | 4/1988 | Ries | 315/501 |
| 5,623,240 A * | 4/1997 | Sakuraba et al. | 335/216 |
| 5,812,042 A * | 9/1998 | Maki et al. | 335/216 |
| 6,838,694 B2 | 1/2005 | Esteve et al. | 257/34 |
| 7,335,909 B2 | 2/2008 | Amin et al. | 257/34 |
| 7,432,705 B2 * | 10/2008 | Seki et al. | 324/248 |
| 2003/0218872 A1 * | 11/2003 | Tsukada et al. | 361/816 |
| 2004/0232912 A1 | 11/2004 | Tsukamoto et al. | 324/248 |
| 2006/0147154 A1 | 7/2006 | Thom et al. | 385/37 |
| 2006/0225165 A1 | 10/2006 | Maassen van den Brink et al. | 977/933 |

FOREIGN PATENT DOCUMENTS
EP 0445657 9/1991
JP 4276594 10/1992

OTHER PUBLICATIONS

U.S. Appl. No. 12/017,995, filed Jan. 22, 2008, Harris.
U.S. Appl. No. 12/013,192, filed Jan. 11, 2008, Rose et al.
U.S. Appl. No. 60/986,554, filed Nov. 8, 2007, Choi.
U.S. Appl. No. 61/039,710, filed Mar. 26, 2008, Maubaum et al.
Blatter et al., "Design aspects of superconducting-phase quantum bits," *Physical Review B* 63:174511-1-174511-9, 2001.
Friedman et al., "Quantum superposition of distinct macroscopic states," *Nature* 406:43-46, Jul. 6, 2000.

(Continued)

*Primary Examiner* — Patrick Salce
(74) *Attorney, Agent, or Firm* — Seed IP Law Group PLLC (57) ABSTRACT

A localized area is at least partially contained within a perimeter of a shield ring formed by a closed superconducting current path of a material that is superconductive below a critical temperature. The shield ring is at least partially within a perimeter of a compensation coil that is coupled to a current source. One or more measurement devices are responsive to magnetic fields in the vicinity of the localized area, allowing compensation by controlling current to the compensation coil. A heater can raise temperature of the shield ring out of a superconducting condition.

21 Claims, 7 Drawing Sheets

OTHER PUBLICATIONS

Il'ichev et al., "Continuous Monitoring of Rabi Oscillations in a Josephson Flux Qubit," *Physical Review Letters* 91(9):097906-1-097906-4, week ending Aug. 29, 2003.

Makhlin et al., "Quantum-State Engineering with Josephson-Junction Devices," *Reviews of Modern Physics* 73(2):357-400, Apr. 2001.

Mooij et al., "Josephson Persistent-Current Qubit," *Science* 285:1036-1039, Aug. 13, 1999.

Nielsen et al., *Quantum Computation and Quantum Information*, Cambridge University Press, Cambridge, 2000, "7.8 Other implementation schemes," pp. 343-345.

Orlando et al., "Superconducting Persistent-Current Qubit," *Physical Review B* 60(22):15 398-15 413, Dec. 1, 1999.

Pobell, Matter and Methods at Low Temperatures, Springer-Verlag, Second Edition, 120-156, 1996.

* cited by examiner

SYSTEMS, METHODS, AND APPARATUS FOR SUPERCONDUCTING MAGNETIC SHIELDING

CROSS REFERENCE TO RELATED APPLICATIONS

This application claims benefit under 35 U.S.C. 119(e) of U.S. Provisional Patent Application Ser. No. 60/981,763, filed Oct. 22, 2007, entitled "Systems, Methods, and Apparatus for Superconducting Magnetic Shielding", which is incorporated herein by reference in its entirety.

BACKGROUND

1. Field

The present systems, methods, and apparatus relate to superconducting magnetic shielding and compensatory magnetic shielding with superconducting devices.

2. Superconducting Qubits

There are many different hardware and software approaches under consideration for use in quantum computers. One hardware approach uses integrated circuits formed of superconducting materials, such as aluminum or niobium. The technologies and processes involved in designing and fabricating superconducting integrated circuits are similar in some respects to those used for conventional integrated circuits.

Superconducting qubits are a type of superconducting device that can be included in a superconducting integrated circuit. Superconducting qubits can be separated into several categories depending on the physical property used to encode information. For example, they may be separated into charge, flux and phase devices, as discussed in, for example Makhlin et al., 2001, Reviews of Modern Physics 73, pp. 357-400. Charge devices store and manipulate information in the charge states of the device, where elementary charges consist of pairs of electrons called Cooper pairs. A Cooper pair has a charge of 2e and consists of two electrons bound together by, for example, a phonon interaction. See e.g., Nielsen and Chuang, Quantum Computation and Quantum Information, Cambridge University Press, Cambridge (2000), pp. 343-345. Flux devices store information in a variable related to the magnetic flux through some part of the device. Phase devices store information in a variable related to the difference in superconducting phase between two regions of the phase device. Recently, hybrid devices using two or more of charge, flux and phase degrees of freedom have been developed. See e.g., U.S. Pat. No. 6,838,694 and U.S. Pat. No. 7,335,909.

Examples of flux qubits that may be used include rf-SQUIDs, which include a superconducting loop interrupted by one Josephson junction, or a compound junction (where a single Josephson junction is replaced by two parallel Josephson junctions), or persistent current qubits, which include a superconducting loop interrupted by three Josephson junctions, and the like. See e.g., Mooij et al, 1999, Science 285,1036; and Orlando et al, 1999, Phys. Rev. B 60,15398. Other examples of superconducting qubits can be found, for example, in Il'ichev et al., 2003, Phys. Rev. Lett. 91, 097906; Blatter et al., 2001, Phys. Rev. B 63,174511, and Friedman et al., 2000, Nature 406, 43. In addition, hybrid charge-phase qubits may also be used.

The qubits may include a corresponding local bias device. The local bias devices may include a metal loop in proximity to a superconducting qubit that provides an external flux bias to the qubit. The local bias device may also include a plurality of Josephson junctions. Each superconducting qubit in the quantum processor may have a corresponding local bias device or there may be fewer local bias devices than qubits. In some embodiments, charge-based readout and local bias devices may be used. The readout device(s) may include a plurality of dc-SQUID magnetometers, each inductively connected to a different qubit within a topology. The readout device may provide a voltage or current. The dc-SQUID magnetometers including a loop of superconducting material interrupted by at least one Josephson junction are well known in the art.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in US Patent Publication No. 2006-0225165, U.S. patent application Ser. No.12/013,192, U.S. Provisional Patent Application Ser. No. 60/986,554 filed Nov. 8, 2007 and entitled "Systems, Devices and Methods for Analog Processing," and U.S. Provisional Patent Application Ser. No. 61/039,710, filed Mar. 26, 2008 and entitled "Systems, Devices, And Methods For Analog Processing."

A superconducting quantum processor may include a number of coupling devices operable to selectively couple respective pairs of qubits. Examples of superconducting coupling devices include rf-SQUIDs and dc-SQUIDs, which couple qubits together by flux. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in US Patent Publication No. 2006-0147154 and U.S. patent application Ser. No. 12/017,995. Respective coupling strengths of the coupling devices may be tuned between zero and a maximum value, for example, to provide ferromagnetic or anti-ferromagnetic coupling between qubits.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

Refrigeration

According to the present state of the art, a superconducting material may generally only act as a superconductor if it is cooled below a critical temperature that is characteristic of the specific material in question. For this reason, those of skill in the art will appreciate that a computer system that implements superconducting processors may implicitly include a refrigeration system for cooling the superconducting materials in the system. Systems and methods for such refrigeration systems are well known in the art. A dilution refrigerator is an example of a refrigeration system that is commonly implemented for cooling a superconducting material to a temperature at which it may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems, methods and apparatus are not limited to applications involving dilution refrigerators, but rather may be applied using any type of refrigeration system.

BRIEF SUMMARY

At least one embodiment may be summarized as a magnetic shielding system including a first shield ring formed by a closed superconducting current path of a material that is superconductive below a critical temperature; a current control system that includes at least one electrical current source; a first compensation coil formed by a conductive current path that is conductively coupled to the current control system; and a first measurement device positioned to measure magnetic fields in a vicinity of the first shield ring, the first measurement device communicatively coupled to the current control system.

In some embodiments, at least a portion of the first shield ring may be positioned within a perimeter of the first compensation coil.

The first measurement device may be a magnetometer. The first shield ring may be selected from the group consisting of a loop of superconductive wire and a superconductive trace on a substrate. The first compensation coil may be selected from the group consisting of a loop of conductive wire and a conductive trace on a substrate.

The magnetic shielding system may further include a superconducting processor chip wherein at least a portion of the superconducting processor chip may be within a perimeter of the first shield ring. The superconducting processor chip may include a superconducting quantum processor. The first shield ring may be formed by a superconductive trace on the superconducting processor chip. The first compensation coil may be formed by a conductive trace on the superconducting processor chip. The first measurement device may be at least partially within a perimeter of the first shield ring. The first shield ring and the first compensation coil may be positioned in a common plane.

The magnetic shielding system may further include at least a second measurement device that may be communicatively coupled to the current control system. The first and second measurement devices may measure approximately perpendicularly to one another.

The magnetic shielding system may further include at least a second shield ring formed by a closed superconducting current path of a material that is superconductive below a critical temperature; and at least a second compensation coil formed by a conductive current path, wherein each compensation coil may be conductively coupled to the current control system. In some embodiments, each of the shields rings may be at least partially within a perimeter of a respective one of the compensation coils. The at least two shield rings may be aligned approximately perpendicular to one another. The current control system may include at least one signal amplifier. The current control system may include at least one analog-to-digital converter.

The magnetic shielding system may further include a controllable heater positioned sufficiently proximate the first shield ring such that heat produced by the controllable heater may cause the temperature of the first shield ring to exceed the critical temperature. The controllable heater may be conductively coupled to an electrical current source and the controllable heater may be controlled by a magnitude of an electrical current.

At least one embodiment may be summarized as a method of controlling magnetic fields in a localized environment, including at least partially forming a perimeter around the localized environment with at least one shield ring formed by a closed superconducting current path of a material that is superconductive below a critical temperature; measuring at least one magnetic field in at least one direction in a vicinity of the localized environment; controlling at least one current through at least one compensation coil to generate at least one compensatory magnetic field in the vicinity of the localized environment; refining the at least one current until the at least one magnetic field in the vicinity of the localized environment reaches a desired level; and trapping the at least one compensatory magnetic field with the at least one shield ring.

The localized environment may contain a superconducting processor chip. The superconducting processor chip may include a superconducting quantum processor. Trapping may include cooling the at least one shield ring to a temperature below a critical temperature of a material that forms the at least one shield ring.

The method of controlling magnetic fields in a localized environment may further include deactivating the at least one current once the at least one compensatory magnetic field has been trapped.

BRIEF DESCRIPTION OF THE SEVERAL
VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with analog processors, such as quantum processors, quantum devices, coupling devices and control systems including microprocessors and drive circuitry have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The present systems, methods and apparatus describe techniques for controlling the ambient magnetic field in a localized environment. The teachings provided herein may be applied in any system where control over environmental magnetic fields is desired. Such control may be desired in systems whose components are highly sensitive to magnetic fields, such as for example, superconducting processors and superconducting quantum processors.

A common technique for reducing ambient magnetic fields in sensitive systems is to encase the system in a hollow superconducting cylinder that is closed at one end. The superconducting cylinder may be wrapped by at least one compensation coil. At a temperature above the critical temperature of the superconducting cylinder (that is, while the superconducting cylinder is not behaving as a superconductor), the ambient magnetic field inside the cylinder is monitored with a measurement device, such as for example a magnetometer. A dc-current is passed through the compensation coil(s) to produce a magnetic field that interferes (either destructively or constructively, depending on the desired impact on the system) with the ambient magnetic field measured inside the cylinder. Once the desired magnetic field has been produced and maintained inside the cylinder, the temperature of the system is reduced below the critical temperature of the superconducting cylinder such that the cylinder becomes superconducting. When this occurs, the cylinder may naturally trap the magnetic flux that is being generated by the compensation coil(s), thereby locking the equilibrium and allowing the dc-current being applied to the compensation coil(s) to be switched off. A similar technique is described in Japanese Patent Application JP4276594. Throughout the remainder of this specification, this technique of implementing compensation coils wrapped around a cylindrical superconducting shield is referred to as "the cylinder approach."

The cylinder approach described above has certain drawbacks. For instance, the cylinder approach requires a massive and bulky cylindrical superconducting shield. This shield may be expensive, may take up a lot of space in the refrigeration system, and may demand a lot of cooling power in order to cool to superconducting temperatures. Furthermore, once the cylinder has been cooled below its superconducting critical temperature, it may be necessary to re-heat the cylinder above the critical temperature in order to adjust or reset the magnetic field within the cylinder. For a massive cylindrical superconducting shield, such re-heating may require heating of the entire refrigeration system which can be a lengthy and expensive procedure. The present systems, methods and apparatus describe a compensatory technique to reduce the ambient magnetic field in a localized environment that is far more space-efficient, cost-efficient and flexible than the existing cylinder approach.

Embodiments of the present systems, methods and apparatus implement principles that are similar in some respects to those described in the cylinder approach; however the present systems, methods and apparatus eliminate the need for a bulky cylindrical superconducting shield. Instead, the cylindrical superconducting shield is replaced by at least one shield ring or annulus that is superconducting at or below a critical temperature. Throughout this specification, the terms "superconducting ring" and "shield ring" are each used to describe a closed superconducting current path and does not limit the geometry of such a shield ring to being circular, nor does it limit the thickness of such a shield ring in any dimension.

Figure 1:
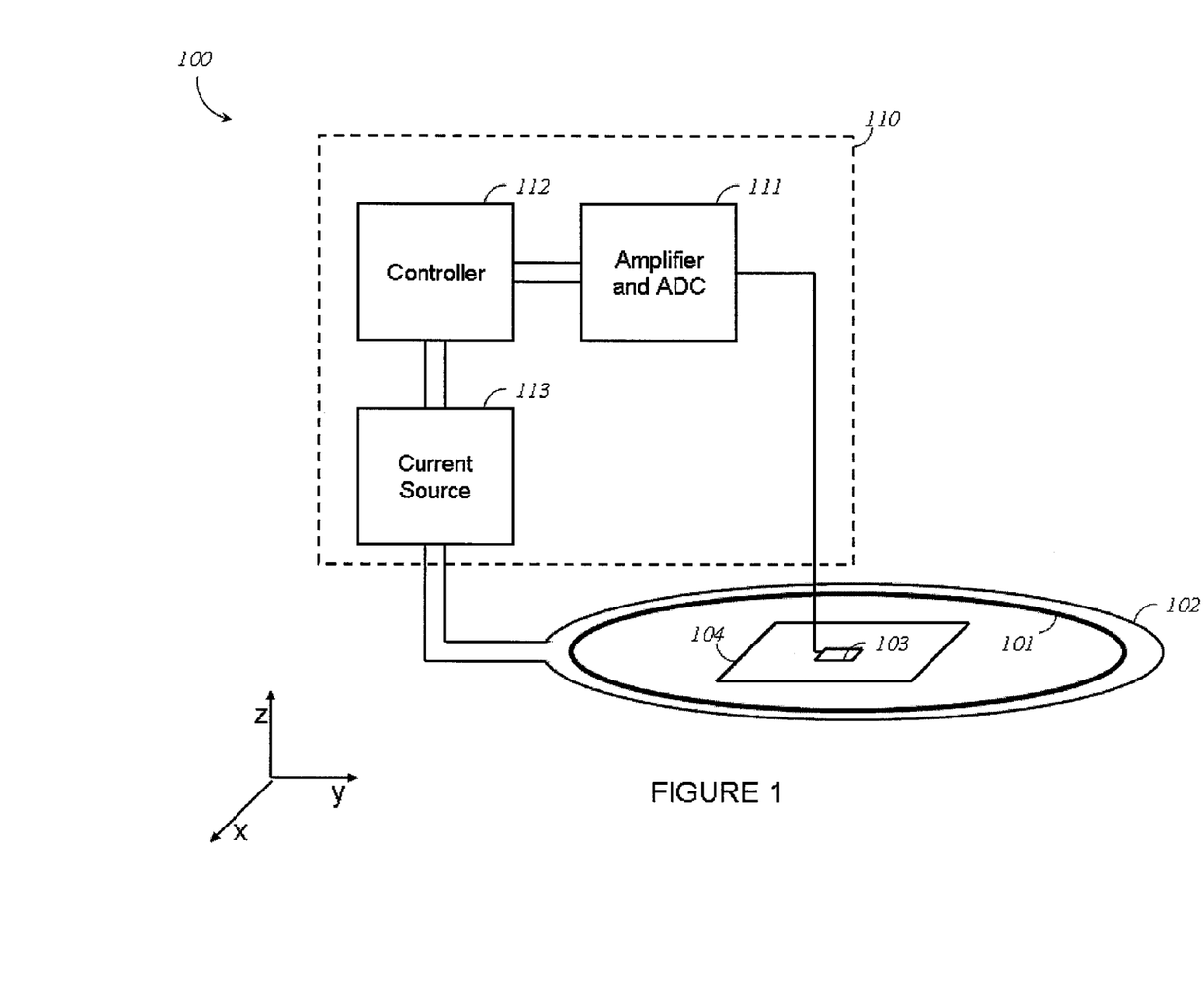
FIG. 1 is a schematic diagram of an embodiment of a compensatory magnetic shielding system that implements a superconducting ring that is enclosed by a compensation coil.

FIG. 1 is a schematic diagram of an embodiment of a compensatory magnetic shielding system 100 that implements a shield ring 101 that is superconductive below a critical temperature and which is enclosed by a compensation coil 102. System 100 may be used to control the magnetic field that exists in the planar region contained within shield ring 101. Those of skill in the art will appreciate that shield ring 101 may be realized in a variety of ways, including but not limited to: a wire of superconducting material, a superconducting trace on a PCB, and a closed strip of superconducting material. Similarly, those of skill in the art will appreciate that compensation coil 102 may be realized in a variety of ways, including but not limited to: a wire of conductive material, a trace on a PCB, and a closed strip of conducting material. Compensation coil 102 may be superconducting, or it may be non-superconducting. Thus, throughout this specification, the term "compensation coil" is used to describe a conductive current path through which controlled currents are passed to generate compensatory magnetic fields.

The magnetic field at a point in the vicinity of shield ring 101 may be measured by measurement device 103, which may be a magnetometer such as a dc-SQUID magnetometer or a giant magnetoresistance sensor. The signal from measurement device 103 may be sent through a dc-current control system 110, in which it may be amplified and converted by amplifier and ADC system 111 and then transmitted to controller 112. Controller 112 may respond to the magnetic field measurement from measurement device 103 by initiating a dc-current output from current source 113. The dc-current output by current source 113 may be passed through compensation coil 102 that may be wrapped around shield ring 101. This dc-current may induce a compensatory magnetic field that is at least partially contained within shield ring 101. Thus, the compensatory magnetic field may be used to interfere with the ambient magnetic field that exists in the planar region contained within shield ring 101. Those of skill in the art will appreciate that dc-current control system 110 may include additional or alternative components and devices and is not limited to include strictly the components and devices described in this embodiment. Similarly, alternative forms of magnetic shielding may be accomplished using ac-currents through compensation coil 102.

Throughout this specification and the appended claims, magnetic field measurements are frequently described as being made "in the vicinity of" a region or device, such as "in the vicinity of a shield ring." In some implementations, magnetic field measurements within a region or at a device may not be possible, and thus measurements may be made nearby to establish a good approximation of the actual conditions within the region or at the device. Thus, for the purposes of this specification and the appended claims, to measure "in the vicinity of" a particular region or device is to measure at a point in sufficiently close proximity to the particular region or device to establish a characterization of the conditions within the particular region or at the particular device.

In some embodiments, it may be desired to reduce the magnetic field that exists within shield ring 101. In such embodiments, the compensatory magnetic field may be produced to destructively interfere with and cancel out the ambient magnetic field that exists within shield ring 101. The effects of the compensatory magnetic field may be monitored by measurement device 103 and the compensatory magnetic field may be refined until the measurement device 103 indicates that the desired magnetic field has been attained. In some embodiments, the compensatory magnetic field trapped by shield ring 101 may not be constant across the planar region contained within the shield ring 101 (i.e., the field may be stronger closer to a perimeter of the shield ring 101 and decrease towards a center of shield ring 101). However, those of skill in the art will appreciate that such a gradient may be accounted for in establishing compensatory magnetic fields within the planar region contained by shield ring 101.

In some embodiments, the compensatory magnetic field is produced and refined at a temperature that exceeds the critical temperature of superconducting ring 101. That is, in some embodiments the compensatory magnetic field is established while shield ring 101 is not acting as a superconductor. Once the compensatory magnetic field has been established and the desired magnetic field is maintained within shield ring 101, the temperature of system 100 may be reduced below the critical temperature of shield ring 101 such that shield ring 101 becomes superconducting. At such a temperature, shield ring 101 may trap the magnetic flux contained within its perimeter and thereby maintain the compensatory magnetic field contained within its perimeter. Thus, once the system has been cooled below the critical temperature of shield ring 101, the controlling dc-current may be switched off without affecting the magnetic field within shield ring 101.

In other embodiments, the compensatory magnetic field may be established at a temperature that is below the critical temperature of shield ring 101 and the dc-current may similarly be deactivated once the desired magnetic field is obtained within shield ring 101.

In system 100, shield ring 101 is used to enclose a superconducting processor chip 104, which may be a superconducting quantum processor chip. Throughout the remainder of this specification, various embodiments of the present systems, methods and apparatus are described that use a superconducting processor chip to represent a system for which magnetic shielding is desired. While the present systems, methods and apparatus are well-suited to shielding a superconducting processor chip, those of skill in the art will appreciate that other embodiments may be used to shield systems other than superconducting processor chips.

By using system 100, the magnetic field present in the local environment of superconducting processor chip 104 may be reduced to a level that improves the operation of superconducting processor chip 104. As previously discussed, those of skill in the art will appreciate that shield ring 101 need not be circular in geometry. An aspect of the present systems, methods and apparatus is that shield ring 101 may take on any shape to enclose any desired planar region. The only restriction on the shape of shield ring 101 is that it be a closed path which may be superconducting below a critical temperature.

Figure 2:
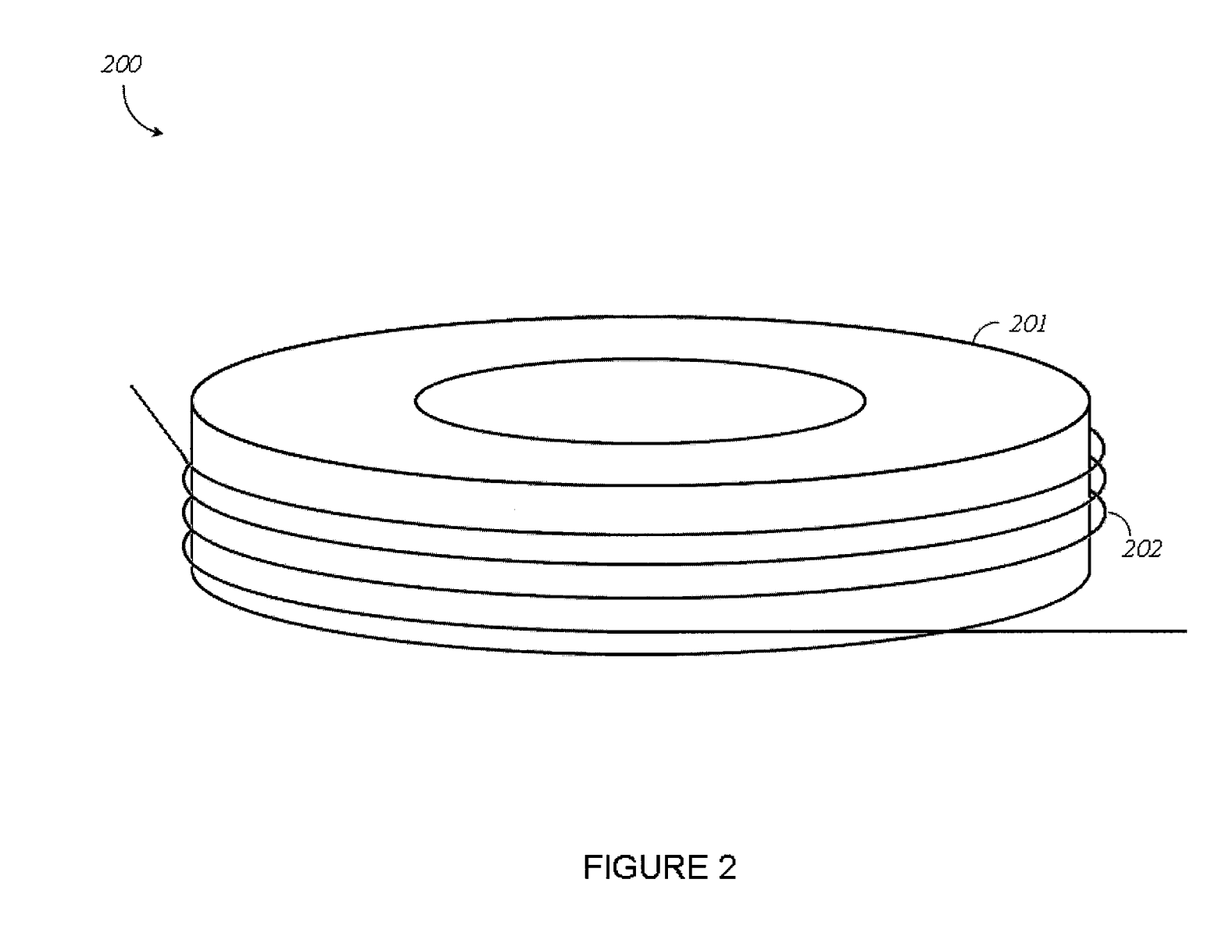
FIG. 2 is an isometric view of an embodiment of a compensatory magnetic shielding system that implements a superconducting ring that is wrapped by a compensation coil.

FIG. 2 is an isometric view of an embodiment of a compensatory magnetic shielding system 200 that implements a shield ring 201 that is superconducting below a critical temperature and is wrapped by a compensation coil 202. In some embodiments of the present systems, methods and apparatus, a compensation coil 202 may be wrapped at least once around a perimeter of a shield ring 201. Furthermore, a shield ring 201 may have some thickness in the indicated z-direction that may allow a compensation coil 202 to be wrapped multiple times around the perimeter of the shield ring 201. Those of skill in the art will appreciate that a shield ring 201 may have any thickness in each of the x-, y-, and z-directions as required by the system in which the shield ring 201 is implemented.

In other embodiments, a compensation coil 202 may be located further away from a shield ring 201, such that the perimeter of the shield ring 201 is enclosed by a compensation coil 202 at least once, but there need not be direct contact between the shield ring 201 and the compensation coil 202. For instance, rather than enclosing a superconductor chip, the shield ring may be located on the superconducting chip itself.

Figure 3A:
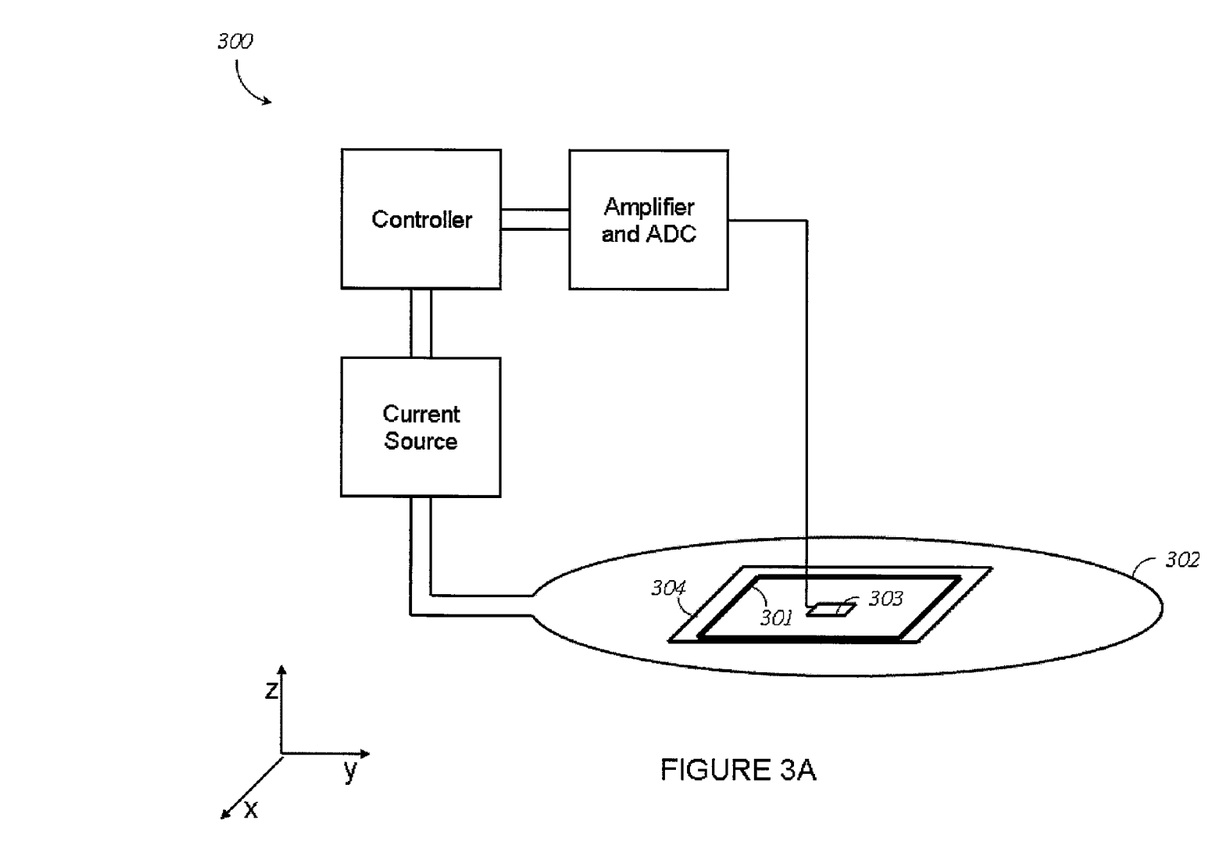
FIG. 3A is a schematic diagram of an embodiment of a compensatory magnetic shielding system that implements a superconducting ring that is located on a superconducting chip that is enclosed by a compensation coil.

FIG. 3A is a schematic diagram of an embodiment of a compensatory magnetic shielding system 300 that implements a shield ring 301 that is located on a superconducting chip 304 that is enclosed by a compensation coil 302. System 300 may be operated in much the same way as system 100, even though shield ring 301 is further away from compensation coil 302 and there is no direct contact therebetween. In some embodiments, shield ring 301 may be realized with a superconducting trace on a PCB or on superconducting processor chip 304. In the embodiment shown in FIG. 3A, superconducting ring 301 is shown as being square in geometry, though those of skill in the art will appreciate that any geometry may be used for shield ring 301 provided that a closed path is formed. Similar to system 100, a measurement device 303, such as for example a magnetometer, may be used to measure the magnetic field in the vicinity of the planar region contained within shield ring 301.

Figure 3B:
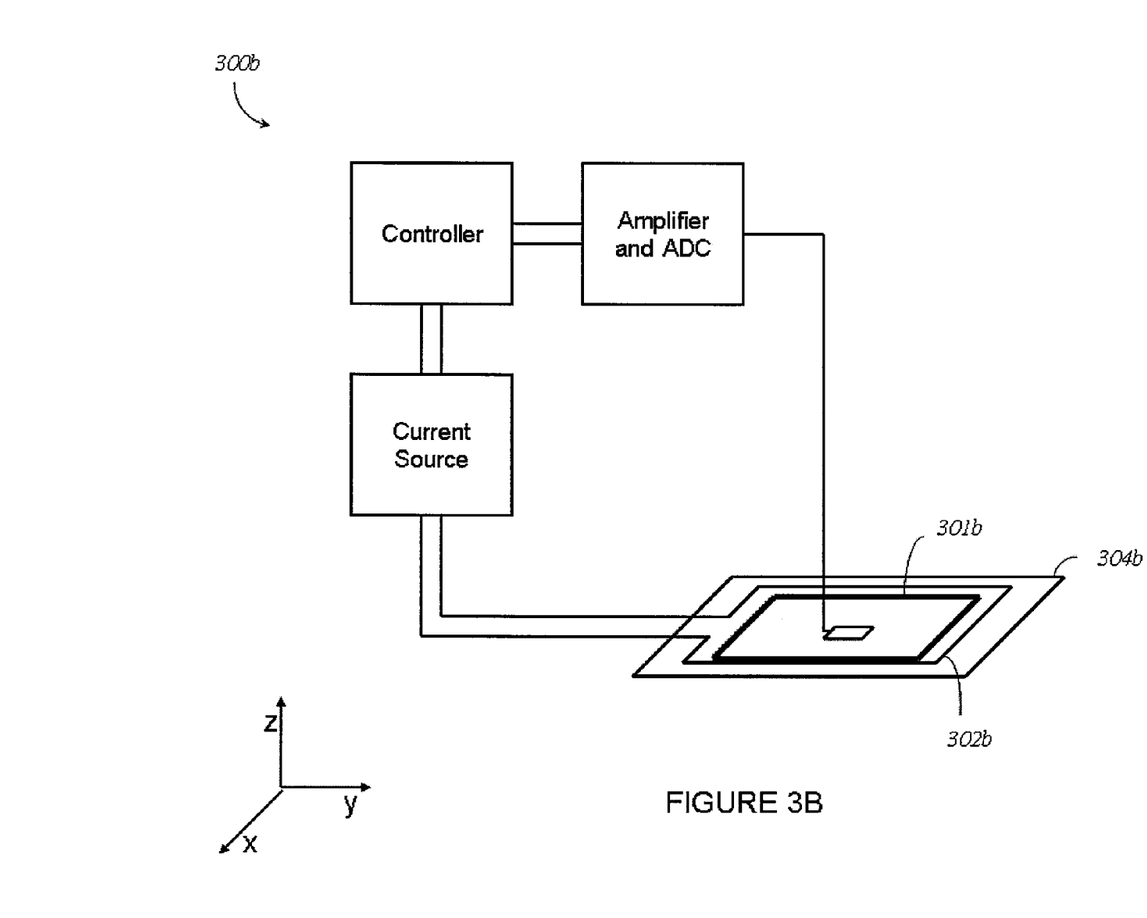
FIG. 3B is a schematic diagram of an embodiment of a compensatory magnetic shielding system in which both the superconducting ring and the compensation coil are located on a superconducting chip.

FIG. 3B is a schematic diagram of an embodiment of a compensatory magnetic shielding system 300b in which both the shield ring 301b and the compensation coil 302b are located on a superconducting chip 304b.

In some embodiments of the present systems, methods and apparatus, the measurement device (such as measurement device 303 in FIG. 3A) may disrupt or interfere with the operation of the sensitive devices from which magnetic fields are being shielded. Therefore, it can be advantageous to move the measurement device away from the shielded region itself. Reliable measurements of the magnetic field that exists in the planar region contained within a shield ring may still be established by averaging the readings from multiple measurement devices.

Figure 4:
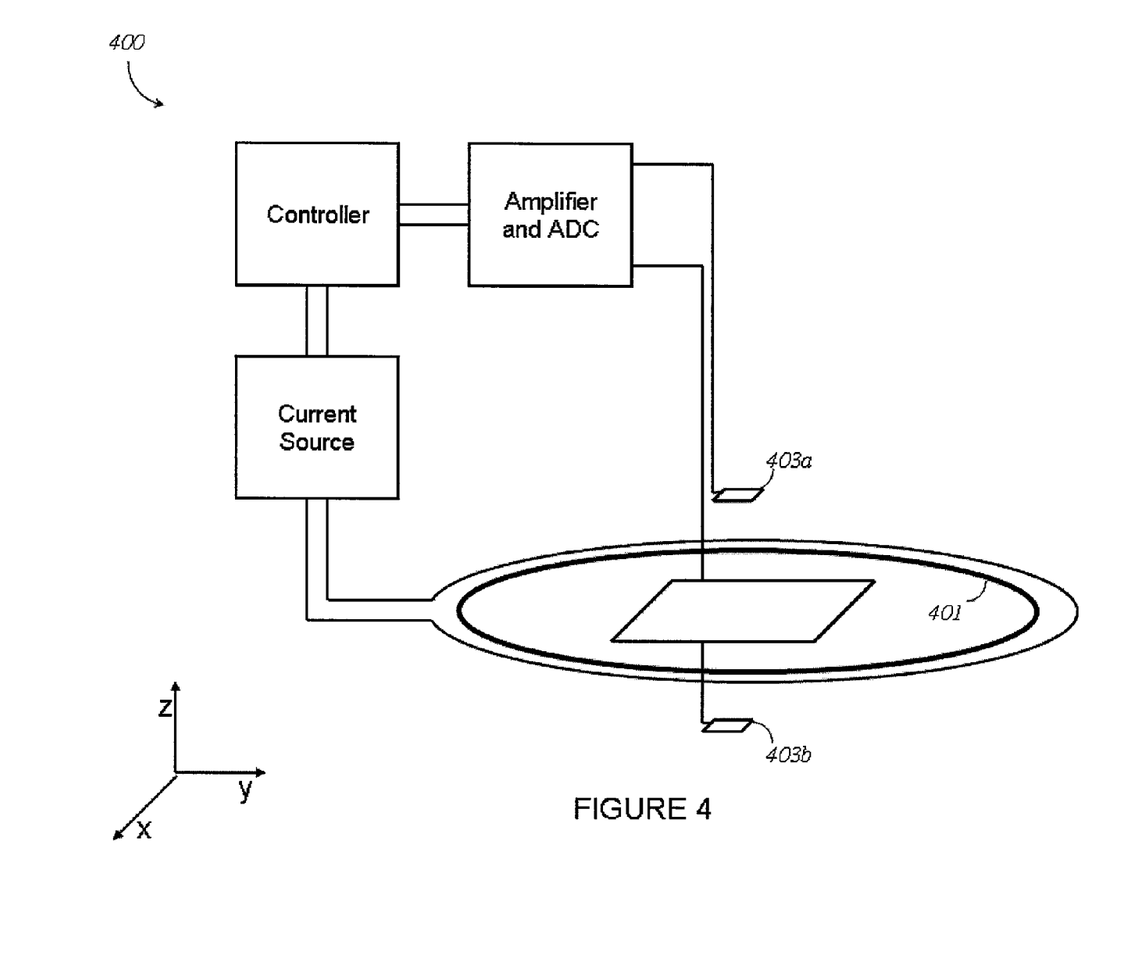
FIG. 4 is a schematic diagram of an embodiment of a compensatory magnetic shielding system that implements two measurement devices that are positioned away from the superconducting processor chip that is being shielded.

FIG. 4 is a schematic diagram of an embodiment of a compensatory magnetic shielding system 400 that implements two measurement devices 403a and 403b that are positioned away from the superconducting chip 404 that is being shielded. System 400 operates in much the same way as system 100, except that measurement devices 403a and 403b are sufficiently distant from superconducting chip 404 that their influences upon superconducting chip 404 are reduced to within acceptable levels. In this embodiment, at least two measurement devices 403a and 403b are used to provide a measure of the magnetic fields within the vicinity of superconducting chip 404. Averaging of the readings from measurement devices 403a, 403b establishes at least an approximation of the magnetic fields in the planar region contained within shield ring 401. Those of skill in the art will appreciate that the number of measurement devices used, as well as the relative positions of the measurement devices, may depend on the requirements of the specific system in which the compensatory magnetic shielding system is being implemented.

The previous embodiments have involved measuring magnetic fields in one direction (the z-direction in FIGS. 1, 3A, 3B, and 4) and compensating by establishing interference magnetic fields in the same direction. Such one-dimensional compensatory magnetic shielding systems may be sufficient for some applications. For instance, one-dimensional compensation may be all that is required if the system that is being shielded is primarily planar. In system 100, superconducting processor chip 104 is a planar system with a planar face to which the z-axis is perpendicular. Therefore, magnetic fields in the z-direction may be incident on the large planar face of chip 104. Conversely, chip 104 is comparatively thin in the x- and y-directions and therefore magnetic fields in those directions may have less of an effect as fewer fields from those directions are likely to be incident on the small edges of chip 104. However, in some systems it may be necessary to implement a three-dimensional compensatory magnetic shielding system that compensates for magnetic fields in all directions.

Figure 5:
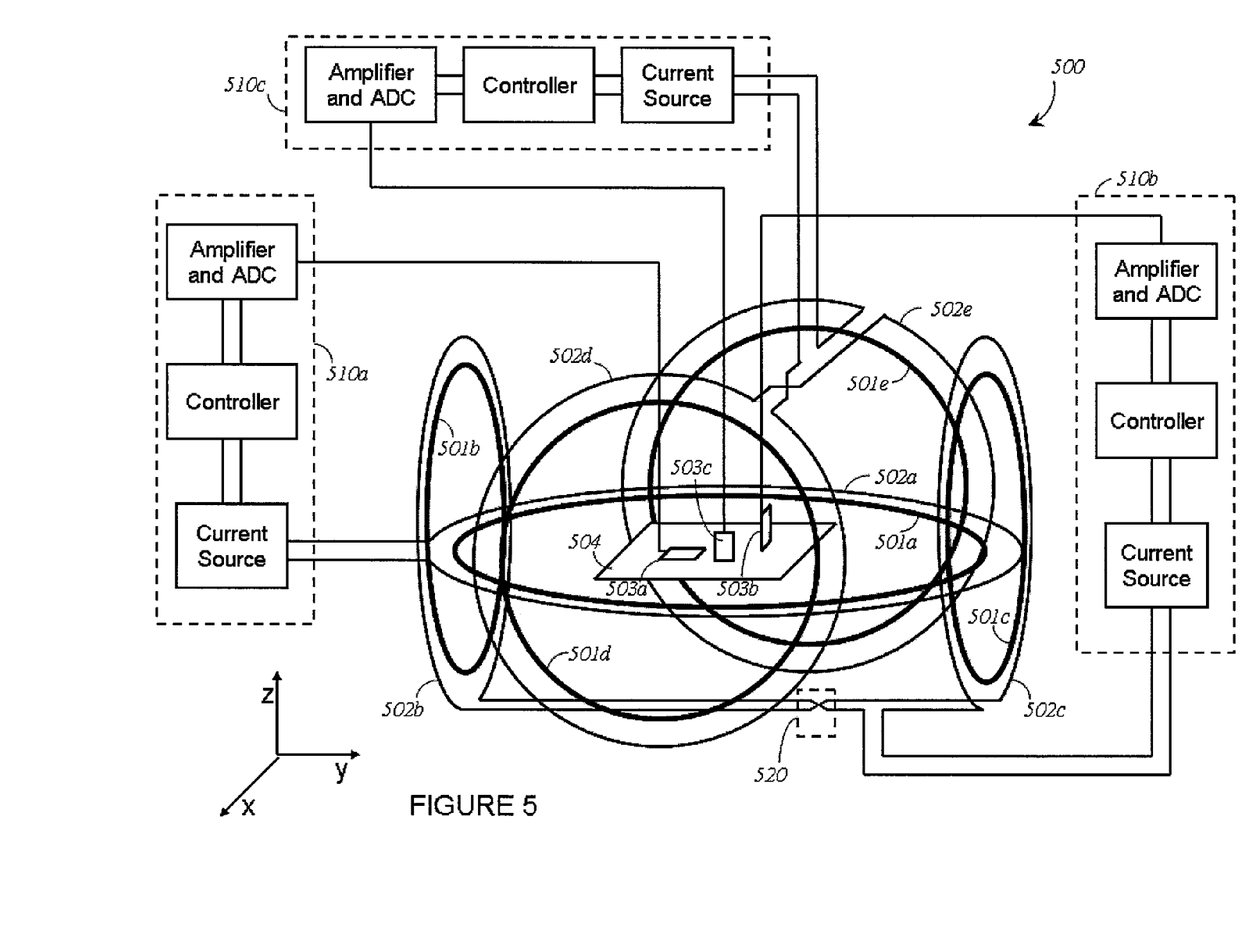
FIG. 5 is a schematic diagram of an embodiment of a three-dimensional compensatory magnetic shielding system.

FIG. 5 is a schematic diagram of an embodiment of a three-dimensional compensatory magnetic shielding system 500. System 500 may operate in a manner that is similar to that previously described for system 100, except that system 500 may provide compensatory magnetic shielding in three directions. System 500 may include all of the components of system 100 (that is, a shield ring 501a to which the z-axis is perpendicular, a compensation coil 502a enclosing shield ring 501a, a measurement device 503a near a superconducting processor chip 504, and a dc-current control system 510a), but may also include similar devices for compensatory magnetic shielding in the x- and y-directions. For compensatory magnetic shielding in the y-direction, system 500 includes shield rings 501b and 501c enclosed by compensation coils 502b and 502c, respectively. Compensation coils 502b and 502c are conductively coupled together and this conductive coupling is crossed at point 520 such that currents in coils 502b and 502c will travel in the same direction. Both compensation coils 502b and 502c are conductively connected to dc-current control system 510b. Dc-current control system 510b responds to magnetic field measurements in the y-direction from measurement device 503b. Similarly, system 500 includes components for compensatory magnetic shielding in the x-direction. Shield rings 501d and 501e may be used to trap compensatory magnetic fields produced by compensation coils 502d and 502e, respectively. Compensation coils 502d and 502e are conductively coupled together and this conductive coupling is crossed such that currents in coils 502b and 502c will travel in the same direction. Compensation coils 502d and 502e are conductively connected to dc-current control system 510c. Dc-current control system 510c responds to magnetic field measurements in the x-direction from measurement device 503c. Those of skill in the art will appreciate that, in some embodiments, a plurality of compensation coils may be controlled using a single current control system. In some embodiments, a single current control system, such as current control system 510a, may be used to control multiple compensation coils that are aligned in at least two different directions, such as the x-direction, the y-direction, and the z-direction. Furthermore, in some embodiments, additional current control systems may be used to control multiple compensation coils that are aligned in the same direction. Throughout this specification and the appended claims, the term "current control system" is used to describe a system that is capable of controlling any number of currents and any number of compensation coils.

In the embodiment shown in FIG. 5, respective pairs of compensation coils and associated shield rings are used to establish compensatory magnetic fields in the x- and y-directions. For instance, compensatory magnetic fields in the y-direction are established through compensation coils 502b and 502c and shield rings 501b and 501c, respectively. Two respective compensation coils are used in both the x-direction and the y-direction in system 500 because superconducting processor chip 504 has significant length in the x- and y-directions. In some embodiments, a single compensation coil (such as compensation coil 502a in system 500) may produce the desired compensatory magnetic fields in the planar region contained within the compensation coil. This is may be sufficient for z-direction compensatory magnetic fields in system 500. However, in order to establish sufficient compensatory magnetic fields across the longer x- and y-directions of chip 504, it may be necessary to incorporate multiple compensation coils and shield rings in those directions. Those of skill in the art will appreciate that any number of compensation coils and associated shield rings may be incorporated in any one direction, or in any number of directions. Furthermore, similar systems may be implemented that provide two dimensional compensatory magnetic shielding, or incorporate multiple compensation coils along non-perpendicular axes.

Unlike the previously described "cylinder" approach, the present systems, methods and apparatus may easily be heated above the critical temperature of the superconducting material(s) to reset or further refine the compensatory magnetic fields. This capability may be desired to accommodate a change in environmental magnetic fields, to reset the compensatory magnetic fields, or to refine the compensatory magnetic fields by thermally cycling the shielding system. For example, in embodiments that use a dc-SQUID as a magnetometer (e.g., magnetometer 103), the system may need to be cooled to superconducting temperatures in order to make a measurement of the magnetic fields. In such embodiments, it may then be desirable to reheat the system and release flux trapped by the shield ring in order to adjust the compensatory magnetic fields.

Figure 6:
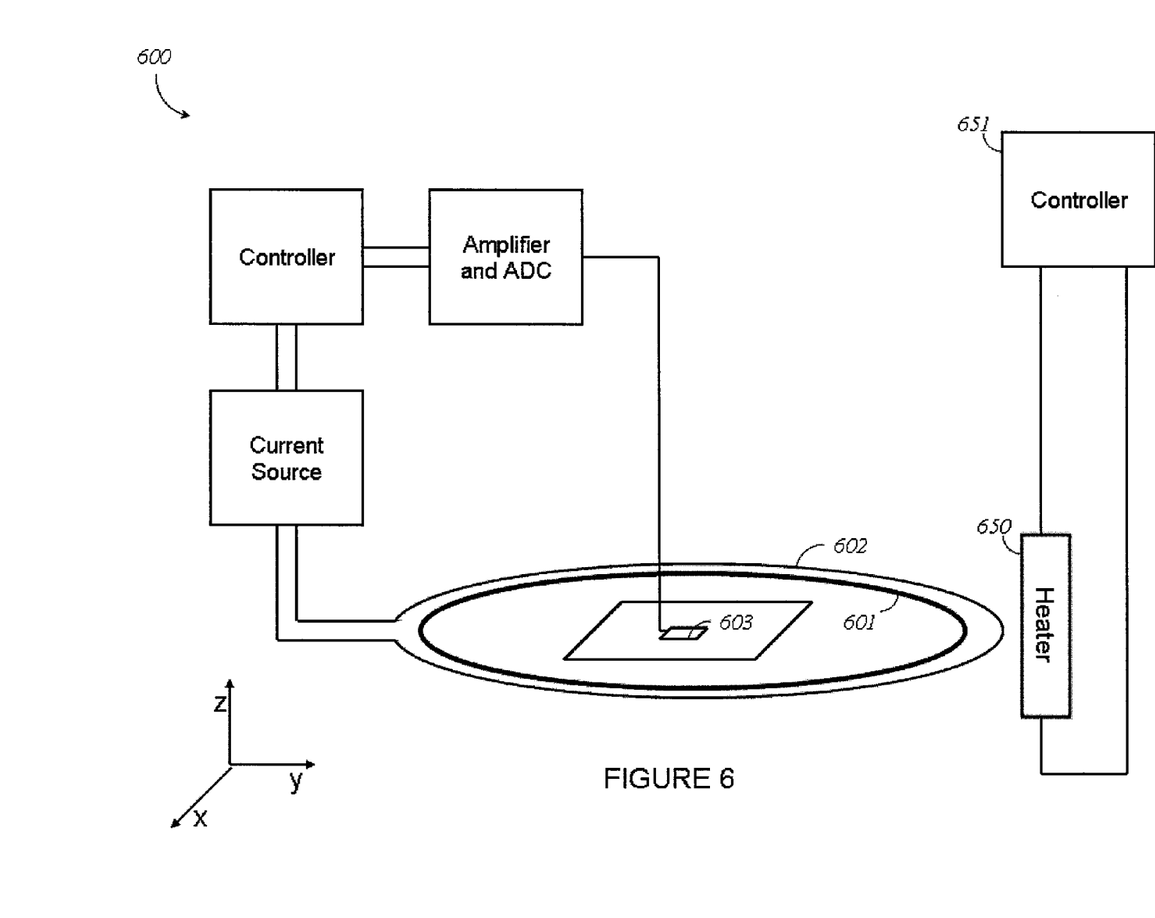
FIG. 6 is a schematic diagram of an embodiment of a compensatory magnetic shielding system that includes a controllable heater operable to reset compensatory magnetic fields trapped by a shield ring.

FIG. 6 is a schematic diagram of an embodiment of a compensatory magnetic shielding system 600 that includes a controllable heater 650 operable to reset the compensatory magnetic fields trapped by shield ring 601. System 600 functions in a similar way to system 100, except that system 600 includes heater 650 which may be coupled to a controller 651.

In some embodiments, controller 651 may include an electrical current source, such that heating power of heater 650 may be controlled by an electrical current. Heater 650 may be integrated into system 600 to heat shield ring 601 above its critical temperature. Thus, if the compensatory magnetic fields that are trapped by shield ring 601 need to be adjusted or reset, heater 650 may be used to locally heat shield ring 601 above its critical temperature and then current may be passed through compensation coil 602 to produce new compensatory magnetic fields. Once the desired compensatory magnetic fields have been produced, heater 650 may be deactivated to allow shield ring 601 to trap the compensatory magnetic fields by returning to its superconducting state. The magnetic fields may be measured using magnetometer 603. In some embodiments, it may be advantageous for shield ring 601 to comprise a superconducting material that has a critical temperature that is lower than the other superconducting components in the system, such that the heat from heater 650 causes only shield ring 601 to transition into a non-superconducting state. Those of skill in the art will appreciate that heater 650 may be realized by a variety of hardware devices, including but not limited to an LED or a resistor. Thus, the present systems, methods and apparatus are well-suited for quick and effective compensatory magnetic field adjustments that do not necessitate a lengthy and expensive reheating of the entire refrigerated system.

As previously discussed, certain aspects of the present systems, methods and apparatus may be realized at room temperature, and certain aspects may be realized at a superconducting temperature. Thus, throughout this specification and the appended claims, the term "superconducting" when used to describe a physical structure such as a "closed superconducting current path" is used to indicate a material that is capable of behaving as a superconductor at an appropriate temperature. A superconducting material may not necessarily be acting as a superconductor at all times in all embodiments of the present systems, methods and apparatus.

Those of skill in the art will appreciate that the various embodiments described herein may be combined with other forms of magnetic shielding systems, including but not limited to the cylindrical approach to magnetic shielding.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to superconducting magnetic shielding systems, methods and apparatus, not necessarily the exemplary superconducting magnetic shielding systems, methods, and apparatus generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application Ser. No. 60/981,763, filed Oct. 22, 2007, entitled "Systems, Methods and Apparatus for Superconducting Magnetic Shielding", U.S. Pat. No. 6,838,694, U.S. Pat. No. 7,335,909, US Patent Publication No. 2006-0225165, U.S. patent application Ser. No.12/013, 192, U.S. Provisional Patent Application Ser. No. 60/986,554 filed Nov. 8, 2007 and entitled "Systems, Devices and Methods for Analog Processing," and U.S. Provisional Patent Application Ser. No. 61/039,710, filed Mar. 26, 2008 and entitled "Systems, Devices, And Methods For Analog Processing", US Patent Publication No. 2006-0147154, and U.S. patent application Ser. No. 12/017,995, are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A magnetic shielding system comprising:
a superconducting processor chip;
a first shield ring formed by a superconductive trace on the superconducting processor chip, wherein the superconductive trace forms a closed superconducting current path of a material that is superconductive below a critical temperature;
a current control system that includes at least one electrical current source;
a first compensation coil formed by a conductive current path that is conductively coupled to the current control system; and
a first measurement device positioned to measure magnetic fields in a vicinity of the first shield ring, the first measurement device communicatively coupled to the current control system.

2. The magnetic shielding system of claim 1 wherein at least a portion of the first shield ring is within a perimeter of the first compensation coil.

3. The magnetic shielding system of claim 1 wherein the first measurement device is a magnetometer.

4. The magnetic shielding system of claim 1 wherein the first compensation coil is selected from the group consisting of a loop of conductive wire and a conductive trace on a substrate.

5. The magnetic shielding system of claim 1 wherein the superconducting processor chip includes a superconducting quantum processor.

6. The magnetic shielding system of claim 1 wherein the first compensation coil is formed by a conductive trace on the superconducting processor chip.

7. The magnetic shielding system of claim 1 wherein the first measurement device is at least partially within a perimeter of the first shield ring.

8. The magnetic shielding system of claim 1 wherein the first shield ring and the first compensation coil are positioned in a common plane.

9. The magnetic shielding system of claim 1, further comprising at least a second measurement device that is communicatively coupled to the current control system.

10. The magnetic shielding system of claim 9 wherein at least the first and the second measurement devices measure approximately perpendicularly to one another.

11. The magnetic shielding system of claim 1, further comprising:
at least a second shield ring formed by a closed superconducting current path of a material that is superconductive below a critical temperature; and at least a second compensation coil formed by a conductive current path, wherein each compensation coil is conductively coupled to the current control system.

12. The magnetic shielding system of claim 11 wherein each of the shield rings is at least partially within a perimeter of a respective one of the compensation coils.

13. The magnetic shielding system of claim 11 wherein at least two shield rings are aligned approximately perpendicular to one another.

14. The magnetic shielding system of claim 1 wherein the current control system includes at least one signal amplifier.

15. The magnetic shielding system of claim 1 wherein the current control system includes at least one analog-to-digital converter.

16. The magnetic shielding system of claim 1, further comprising a controllable heater positioned sufficiently proximate the first shield ring that heat produced by the controllable heater causes the temperature of the first shield ring to exceed the critical temperature.

17. The magnetic shielding system of claim 16 wherein the controllable heater is conductively coupled to an electrical current source and the controllable heater is controlled by a magnitude of an electrical current.

18. A method of controlling magnetic fields in a localized environment on a superconducting processor chip, the method comprising:
    at least partially forming a perimeter around the localized environment with at least one shield ring formed by a superconductive trace on the superconducting processor chip, wherein the superconductive trace forms a closed superconducting current path of a material that is superconductive below a critical temperature;
    measuring at least one magnetic field in at least one direction in a vicinity of the localized environment;
    controlling at least one current through at least one compensation coil to generate at least one compensatory magnetic field in the vicinity of the localized environment;
    refining the at least one current until the at least one magnetic field in the vicinity of the localized environment reaches a desired level; and
    trapping the at least one compensatory magnetic field with the at least one shield ring.

19. The method of claim 18 wherein the superconducting processor chip includes a superconducting quantum processor.

20. The method of claim 18 wherein trapping the at least one compensatory magnetic field includes cooling the at least one shield ring to a temperature below a critical temperature of a material that forms the at least one shield ring.

21. The method of claim 18, further comprising:
    deactivating the at least one current once the at least one compensatory magnetic field has been trapped.

* * * * *